US012282765B2

(12) United States Patent
McDonald et al.

(10) Patent No.: US 12,282,765 B2
(45) Date of Patent: Apr. 22, 2025

(54) AUTOMATED UPDATE MANAGEMENT IN THIRD-PARTY UPDATE NETWORKS

(71) Applicant: Ivanti, Inc., South Jordan, UT (US)

(72) Inventors: Sean McDonald, Saint Paul, MN (US); Johnathan Gohde, Saint Paul, MN (US); Jaremie Romer, Saint Paul, MN (US); Garland Michael Krueger Port, Centerville, MN (US)

(73) Assignee: Ivanti, Inc., South Jordan, UT (US)

( * ) Notice: Subject to any disclaimer, the term of this patent is extended or adjusted under 35 U.S.C. 154(b) by 203 days.

(21) Appl. No.: 18/045,787

(22) Filed: Oct. 11, 2022

(65) Prior Publication Data

US 2023/0114076 A1   Apr. 13, 2023

Related U.S. Application Data

(63) Continuation-in-part of application No. 17/508,748, filed on Oct. 22, 2021, now Pat. No. 11,853,739.

(60) Provisional application No. 63/113,390, filed on Nov. 13, 2020, provisional application No. 63/104,407, filed on Oct. 22, 2020.

(51) Int. Cl.
*G06F 9/44* (2018.01)
*G06F 8/65* (2018.01)

(52) U.S. Cl.
CPC ..................... *G06F 8/65* (2013.01)

(58) Field of Classification Search
CPC .......... G06F 8/65; G06N 5/025; G06N 20/00; G06N 3/04; G06N 3/047; G06Q 20/0855
USPC .................................................. 717/168–178
See application file for complete search history.

(56) References Cited

U.S. PATENT DOCUMENTS

| 2010/0218179 A1* | 8/2010 | Balascio | G06F 8/65 717/171 |
| 2021/0019133 A1* | 1/2021 | Rusev | H04L 41/082 |
| 2021/0019134 A1* | 1/2021 | Rusev | H04L 41/20 |

\* cited by examiner

*Primary Examiner* — Chuck O Kendall (57) ABSTRACT

A method of automated software management includes generating an initial update list including outstanding product updates for an endpoint. The method includes receiving from a third-party agent, product metadata related to products loaded on the endpoint. Based on discovered products, the method includes generating an endpoint-specific inventory including product metadata of the products loaded on the endpoint. The method includes identifying an unnecessary product update of the outstanding product updates not related to the discovered products. The method includes filtering the unnecessary product update from the initial update list to generate a modified update list including a subset of outstanding product updates and omitting the unnecessary product update. The method includes distributing only the subset of outstanding product updates of the modified update list to the managed endpoint.

20 Claims, 6 Drawing Sheets

Recommended Updates

Software Installed on Endpoints 320

| Product Name 376 | Publisher 378 | Version 380 |
|---|---|---|
| First Product 376A | First Publisher 378A | 5.00.8913.1000 380A |
| Second Program 376B | First Publisher 378A | 10.4.0.0 380B |
| Third Program 376C | Second Publisher 378B | 5.0.785.1604 380C |

Recommended Updates 332

| Bulletin 366 | Product Name 376 | Publisher 378 | Security 372 |
|---|---|---|---|
| First Bulletin 366A | First Program 376A | First Publisher 378A | Unspecified |
| Second Bulletin 366B | Second Program 376B | First Publisher 378A | Severe |
| Third Bulletin 366C | Third Program 376C | Second Publisher 378B | Critical |

Create Smart Filter 374

AUTOMATED UPDATE MANAGEMENT IN THIRD-PARTY UPDATE NETWORKS

CROSS-REFERENCE TO RELATED APPLICATIONS

This application is a continuation-in-part of U.S. patent application Ser. No. 17/508,748, filed Oct. 22, 2021, which claims benefit of and priority to U.S. Provisional Application Nos. 63/104,407, filed Oct. 22, 2020, and 63/113,390, filed Nov. 13, 2020. The disclosures of these applications are incorporated herein by reference in their entireties.

FIELD

The embodiments described in this disclosure are related to automated endpoint product management, and in particular to product management using product inventories of managed endpoints from third-party agents.

BACKGROUND

In enterprise and other managed networks, an endpoint refers to a computing device that is integrated into the network and that is in communication with a management device. The management device may include a server device, for instance that has visibility to operating parameters and state parameters of the endpoints. Based on information communicated between the management device and the endpoints, the management device may detect issues at the endpoints, deploy solutions to the endpoints, update software on the endpoints, troubleshoot issues at the endpoints, provision roles and security controls to the endpoints, etc.

One element of the managed networks is coordination and distribution of product updates. Sometimes this operation is referred to as patch management. The updates or patches generally include code changes to products on the managed endpoints or some subset thereof. The products that are updated include software applications, software tools, operating systems, and the like. Distribution of the updates is important to ensure the products are properly functioning and to ensure cybersecurity vulnerabilities are addressed.

In some circumstances, a vendor publicizes the updates that are relevant to its products. Publication of the updates is an ongoing process. For instance, MICROSOFT® has traditionally released software patches on "Patch Tuesday" which occurs on the second and sometimes the fourth Tuesday of each month. In addition, software patches might be released and published responsive to detection of a specific vulnerability. Following publication of the software patches, administrators of the managed networks may access and distribute the product updates.

The managed networks sometimes include one or more endpoints that are not entirely controlled by an administrator of the managed network. For instance, some managed networks may support a bring your own device (BYOD) environment or may include an extensive network of devices and users having distinct roles. The managed network that supports the BYOD environment may allow a user or an employee to use a personal endpoint. Accordingly, the products loaded on the personal endpoint may not be known or controlled by the administrator of the managed network. Similarly, an extensive network may include endpoints that require different and non-standard product inventories.

In these and other managed networks, it is difficult to manage updates properly and efficiently. For example, there may be a mismatch between the product updates that are relevant in the managed network and the product updates that are actually distributed to endpoints in the managed network. Accordingly, some products may persist in an un-patched or out-of-date state because the recommended product updates are not distributed. Additionally, product updates distributed to the endpoints may not apply to any product at the managed endpoint. Distribution of unnecessary product updates decreases available bandwidth in managed networks. Additionally, storage and maintenance of the unnecessary product updates consume computing storage resources and computing processing resources. Accordingly, there is a need to improve the product update management systems and processes.

The subject matter claimed herein is not limited to embodiments that solve any disadvantages or that operate only in environments such as those described. Rather, this background is only provided to illustrate one example technology area where some embodiments described herein may be practiced.

SUMMARY

According to an aspect of the invention, an embodiment includes a method of automated software management of a managed endpoint. The method may include generating an initial update list that includes outstanding product updates for a managed endpoint included in a managed network and in a third-party update network. The method may include receiving, from a third-party agent, product metadata related to products loaded on the managed endpoint, the third-party agent being configured to discover the products. Based on discovered products, the method may include generating an endpoint-specific inventory that includes product metadata of the products loaded on the managed endpoint. The method may include comparing the outstanding update metadata of the initial update list with the product metadata of the endpoint-specific inventory. Based on the comparison, the method may include identifying an unnecessary product update. The unnecessary product update may include one of the outstanding product updates that is not related to at least one of the discovered products. The method may include filtering the unnecessary product update from the initial update list to generate a modified update list. The modified update list may include a subset of the outstanding product updates and omitting the unnecessary product update. The method may include distributing only the subset of the outstanding product updates of the modified update list to the managed endpoint such that the outstanding product updates are received by the managed endpoint and implemented locally on the managed endpoint to modify at least one of the discovered products.

A further aspect of an embodiment may include non-transitory computer-readable medium having encoded therein programming code executable by one or more processors to perform or control performance of one or more of the operations of the methods of automated software management described above.

An additional aspect of an embodiment may include compute device comprising one or more processors and a non-transitory computer-readable medium having encoded therein programming code executable by one or more processors to perform or control performance of one or more of the operations of the methods of automated software management described above.

The object and advantages of the embodiments will be realized and achieved at least by the elements, features, and combinations particularly pointed out in the claims. It is to be understood that both the foregoing general description and the following detailed description are exemplary and explanatory and are not restrictive of the invention, as claimed.

BRIEF DESCRIPTION OF THE DRAWINGS

Example embodiments will be described and explained with additional specificity and detail through the use of the accompanying drawings in which.

DESCRIPTION OF SOME EXAMPLE EMBODIMENTS

The embodiments described in this disclosure are related to automated endpoint product management. Some embodiments provide endpoint product management using accessed product inventories of managed endpoints.

The embodiments of the present disclosure address technical problems that exist in conventional patch management systems. For instance, in some conventional managed networks, product update or patch management is conducted without knowledge of products implemented at managed endpoints. For instance, in some networks, users are allowed to download and use products without expressed approval from or oversight by an administrator. Accordingly, in these conventional management systems, patches may be distributed to endpoints for products that are not currently loaded on the endpoint. Additionally, the management system may overlook and fail to distribute patches that apply to the endpoints. These conventional management systems suffer from persistence of vulnerabilities at the endpoints and inefficient vulnerability management.

Additionally, some conventional patch management systems are built around a third-party update network. The third-party update network is configured to distribute product updates to endpoints and other managed devices. However, the third-party update network may limit distribution and management of some product updates. Accordingly, the third-party update network fails to integrate these product updates, which decreases management of corresponding products. Moreover, the third-party update network suffers from similar issues to on-premises regarding distribution of product updates without product information specific to the managed endpoint.

Some embodiments of the present disclosure address these technical problems. For instance, embodiments include systems and processes implemented with a third-party update network. These and other embodiments coordinate with third-party agents of the third-party update network to discover the products and/or metadata of the products at managed endpoints. An inventory of products at the endpoint are generated based on discovered products. The inventory is used to filter product updates that do not relate to products on the endpoints. Additionally, in some embodiments, the inventory may be used to evaluate a status of the products and to identify previous product updates that have not been implemented on the endpoints. The previous product updates may include product updates that were missed or otherwise not implemented in the products when they were released by vendors. For instance, the previous product updates may have been released months or years ago and not implemented in the products.

Some embodiments are directed to extensions of a third-party update network having a third-party agent such as Microsoft® Intune® that implements a Microsoft Endpoint Manager (MEM) agent. The third-party agents may operate outside a managed network and may be generally maintained and controlled by the third party. In these and other embodiments, the third-party agents may be configured to discover the products at the managed endpoint using third-party application program interfaces (APIs). The third-party agent may communicate discovered products to a management device that filters outstanding product updates, generates recommendations based on a discovered product inventory, and distributes filtered product updates indirectly by the managed device. These and other embodiments extend the coverage of the third-party update networks and refine product update distribution in the third-party update networks.

These and other embodiments are described with reference to the appended Figures in which like item number indicates like function and structure unless described otherwise. The configurations of the present systems and methods, as generally described and illustrated in the Figures herein, may be arranged and designed in different configurations. Thus, the following detailed description of the Figures, is not intended to limit the scope of the systems and methods, as claimed, but is merely representative of example configurations of the systems and methods.

Figure 1:
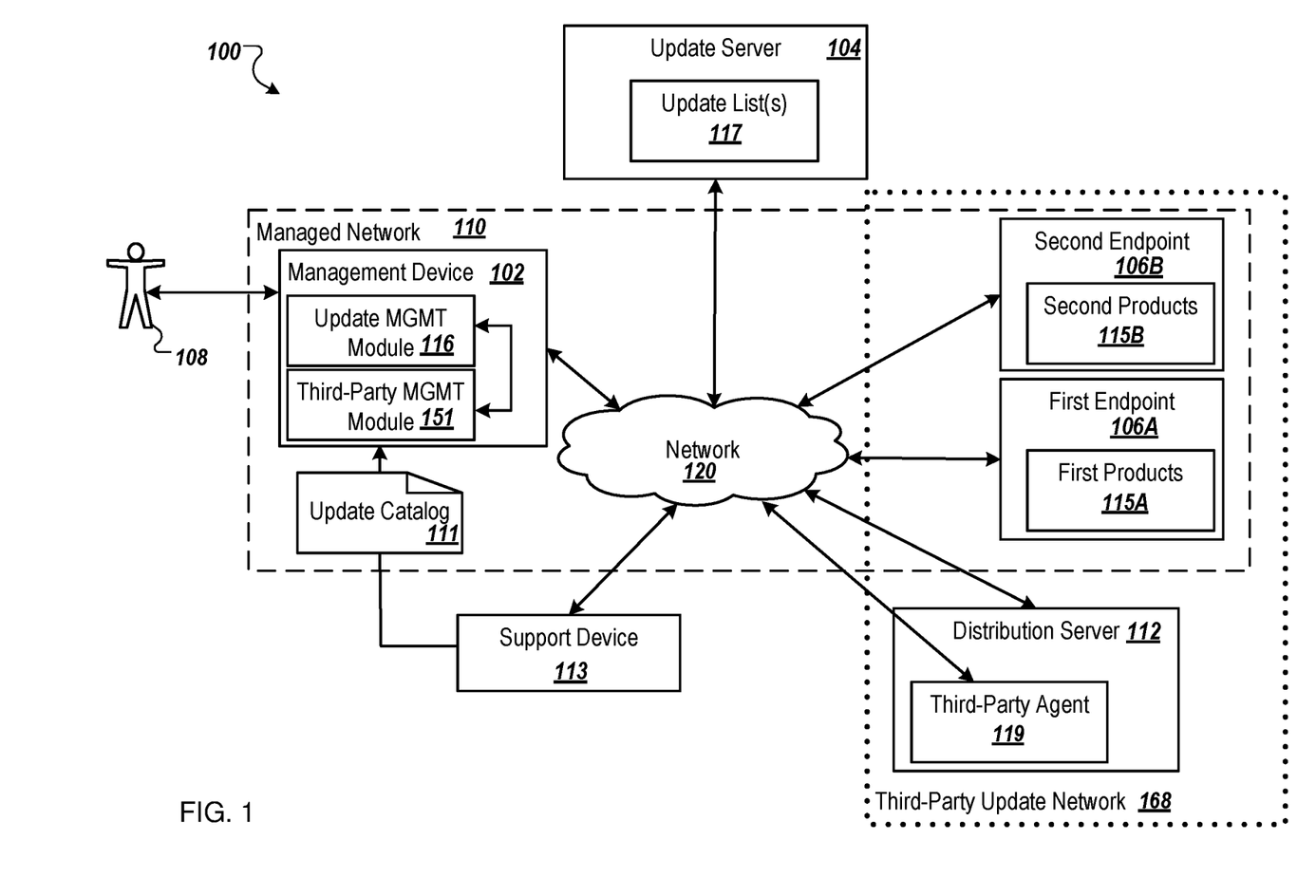
FIG. 1 depicts a block diagram of an example operating environment in some embodiments described in the present disclosure may be implemented.

FIG. 1 is a block diagram of an example operating environment 100 in which some embodiments of the present invention may be implemented. The operating environment 100 may be configured for implementation of product update management of endpoints 106A and 106B (generally, endpoint 106 or endpoints 106). The endpoints 106 may be included in a managed network 110 as well as a third-party update network 168. The third-party update network 168 may be primarily responsible for product update management of the endpoints 106. The managed network 110 may be configured for additional functions that supplement one or more of the processes performed in the third-party update network 168.

The product update management implemented in the operating environment 100 may enable product updates such as software patches and code changes to be accessed, consumed, and distributed to endpoints 106. One or more product update management operations may be based on product inventories of the endpoints 106, which are accessed by a third-party agent 119 in the embodiment of FIG. 1. The product inventories may ensure that product updates distributed to the endpoints 106 are specific and apply to products 115A and 115B (generally, product 115 or products 115) loaded on the endpoints 106. Use of the product inventories prevent or reduce distribution of product updates that are not related to any of the products 115 of the endpoints 106. Moreover, the product inventories of the endpoints 106 may be used to ensure the products 115 of the endpoints 106 are up-to-date or current. For instance, after the product inventory is generated, a status of one or more of the products 115 may be determined. Responsive to one of the products 115 being out-of-date, one or more previous product updates may be distributed to the endpoints 106 to bring the product 115 up to date.

Embodiments of the present disclosure provide a technical improvement to conventional patch management systems. For instance, in some conventional patch management systems, endpoints (e.g., 106) are managed using published product updates. An administrator may review the public product updates and publish outstanding product updates that have not been implemented at the endpoints such that these outstanding product updates may be distributed to endpoints. The administrator in the conventional patch management systems does not have visibility regarding the products (e.g., 115) at the endpoints. Instead, the administrator is conducting a review based on a perceived and incomplete knowledge of which products have been deployed. For instance, the administrator may not know that a particular set of endpoints have installed a particular application or changed to another operating system. Thus, these conventional patch management systems may suffer from inefficiencies resulting from this incomplete knowledge regarding the products at the endpoints.

For instance, one or more of the outstanding product updates may not apply to any products at the endpoints. These outstanding product updates may be reviewed by the administrator and distributed. Because these recommended product updates are not incorporated into any products at the endpoints, technical and computing resources allocated to the outstanding product updates are wasted. Similarly, because the products at the endpoints are not known, the outstanding product updates may not include patches that are relevant to the products on the endpoints. Thus, these products may persist in an out-of-date or unpatched state.

This technical problem is worsened in environments such as the operating environment 100 in which the third-party update network 168 implements the patch management. In these and other systems, a third party may limit product updates that are handled and distributed to the endpoints 106. Accordingly, less about the endpoints 106 is conveyed to the administrator and more of the products 115 (especially those not developed by the third party) may remain in an unpatched and vulnerable state.

Some embodiments of the present disclosure improve conventional patch management systems and address the inefficiencies and technical issues described above. For instance, some embodiments of the management device 102 receive inventories regarding the products 115 of the endpoints 106 from a third-party agent 119. For instance, the third-party agent 119 implements APIs (e.g., Graph API from Microsoft) that access information regarding the products 115. Based on the information regarding the products 115, the management device 102 generates product inventories. The product inventories may be specific to the one or both of the endpoints 106. The product inventories may be used to filter outstanding product updates made available by vendors. Thus, product updates distributed to the endpoints 106 may not include product updates that are not related to at least one of the products 115 on the endpoints 106. Additionally, the product inventories may be used to ensure products on the endpoints 106 are up-to-date or current.

Accordingly, embodiments of the present disclosure are directed to a computer-centric problem and are implemented in a computer-centric environment. For instance, the embodiments of the present disclosure are directed to product update management in the managed network 110. Computing processes occurring in the operating environment 100 include communication and implementation of product updates that include software patches and code changes on the products 115 loaded on the endpoints 106. Communications during the processes described in this present disclosure involve the communication of data in electronic and optical forms via a network 120 and also involve the electrical and optical interpretation of the data and information.

The operating environment 100 may include the managed network 110, the third-party update network 168, an update server 104, and a support device 113. The managed network 110 includes the management device 102 that may communicate with the update server 104, the support device 113, the endpoints 106, and the third-party update network 168 via the network 120. The third-party update network 168 includes the third-party agent 119 and a distribution server 112. Additionally, in some embodiments, the update server 104 or an example of the update server 104 may be included in the third-party update network 168. The components of the operating environment 100 are configured to communicate data and information via the network 120 to perform automated endpoint product management as described in the present disclosure. Each of these components are introduced below.

The network 120 may include any communication network configured for communication of signals between the components (e.g., 102, 119, 113, 108, 112, 104, and 106) of the operating environment 100. The network 120 may be wired or wireless. The network 120 may have configurations including a star configuration, a token ring configuration, or another suitable configuration. Furthermore, the network 120 may include a local area network (LAN), a wide area network (WAN) (e.g., the Internet), and/or other interconnected data paths across which multiple devices may communicate. In some embodiments, the network 120 may include a peer-to-peer network. The network 120 may also be coupled to or include portions of a telecommunications network that may enable communication of data in a variety of different communication protocols.

In some embodiments, the network 120 includes or is configured to include a BLUETOOTH® communication network, a Z-Wave® communication network, an Insteon® communication network, an EnOcean® communication network, a Wi-Fi communication network, a ZigBee communication network, a representative state transfer application protocol interface (REST API) communication network, an extensible messaging and presence protocol (XMPP) communication network, a cellular communications network, any similar communication networks, or any combination thereof for sending and receiving data. The data communicated in the network 120 may include data communicated via short messaging service (SMS), multimedia messaging service (MMS), hypertext transfer protocol (HTTP), direct data connection, wireless application protocol (WAP), or any other protocol that may be implemented in the components of the operating environment 100.

The update server 104 includes a hardware-based computer device or collection thereof that is configured to communicate with the other components of the operating environment 100 via the network 120. The update server 104 is configured to provide access to one or more update lists 117, portions thereof, and information pertaining to entries of the update lists 117. For instance, the update server 104 may host a website on which the update lists 117 are available. The update server 104 may host or store the update lists 117 such that information, metadata, and data related to entries on the update lists 117 may be accessed via the network 120. For instance, the management device 102, the distribution server 112, or the support device 113 may be configured to access the update lists 117 or information related to entries on the update lists 117 via the network 120. In some embodiments, the management device 102, the distribution server 112, or the support device 113 may be configured to communicate an electronic message to the update server 104 that accesses the update lists 117, information (e.g., update metadata) related to entries on the update lists 117, or a specific portion of the update lists 117. Some examples of example APIs for accessing the update lists 117 are available at https://www.circl.lu/services/cve-search/.

The update lists 117 may include a list of entries. The entries relate to a cybersecurity threat, a cybersecurity vulnerability, a software application code change, a patch, a hardware interface modification, or another update to a product. The entries have information related to the entries. For instance, one or more of the entries may include an identification number, an entry date, an entry summary, a links to product updates (e.g., a code change or patch), a threat severity, or some combination thereof.

An example of the update server 104 may be Department of Homeland Security (DHS) server(s). In this example, the update lists 117 may include lists of common vulnerabilities and exposures (CVEs) hosted by the DHS servers. Another example of the update server 104 may be National Institute of Standards and Technology (NIST) servers. In this example, the update lists 117 may include national vulnerability database that is hosted by the NIST servers. The NIST server may host the information assurance vulnerability alerts (IAVAs), which may an example of the update lists 117. One with skill in the art may be familiar with other suitable examples of the update server 104 and the update lists 117. Lists of vulnerabilities and threats are maintained by some additional entities such as MITRE.

The depicted embodiment of the operating environment 100 includes the support device 113. The support device 113 may be a hardware-based computer device configured to communicate data and information with the other components of the operating environment 100 via the network 120. In embodiments that include the support device 113, the update lists 117 may be consumed at the support device 113 to generate an update catalog 111. The update catalog 111 includes records and information related to previous product updates. As the update lists 117 become available, update metadata or other information may be appended to the update catalog 111.

The support device 113 may communicate the update catalog 111 to the management device 102 or may otherwise make available the update catalog 111. For instance, the support device 113 may also communicate the update catalog 111 to a separate host that is connected to the network 120. The update catalog 111 may be accessed from the separate host and stored on a suitable storage medium. The management device 102 may then access the update catalog 111 from the storage medium.

The update catalog 111 may be stored at least temporarily at the management device 102. In other instances, the update catalog 111 may be stored remotely and accessed by the management device 102 via the network 120. In FIG. 1, the update catalog 111 is depicted as being communicated outside the network 120. In some embodiments, the update catalog 111 may be communicated or accessed via the network 120.

In some embodiments, the operating environment 100 may not include the support device 113. In these embodiments, the management device 102 might directly consume information of the update lists 117. Additionally or alternatively, a similar computing device included in the third-party update network 168 may consume the update lists 117 or portions thereof. Additionally, a third party may be configured to generate one or more of the update lists 117. For instance, the third party may operate the third-party update network 168 and accordingly generate the update lists 117 that apply to the products 115 that are developed by the third party.

The third-party update network 168 includes the distribution server 112, the third-party agent 119, and the endpoints 106. Additionally, in some embodiments, the third-party update network 168 may include or directly interface with a third-party management module 151 (in FIG. 1, "third-party MGMT module 151").

The distribution server 112 may be a hardware-based server configured to communicate data and information with the other components of the operating environment 100 via the network 120. The distribution server 112 may be configured to store published product updates or instructions related to published product updates. For example, in some embodiments, the management device 102 may communicate one or more product updates or product update packages to the distribution server 112. One or both of the endpoints 106 may then access the product updates and the product update packages at the distribution server 112. After the product updates and packages are accessed, the product updates may be implemented at one or both of the endpoints 106 to modify code of one of the products 115A or 115B on the endpoints 106.

The distribution server 112 is configured to at least partially manage product updates at the endpoints 106 within the third-party update network 168. For instance, the distribution server 112 may host, at least temporarily, product updates such that the endpoints 106 can access them or may include links to the product updates. Additionally or alternatively, update packages may be published to the distribution server 112. The update packages include data and information related to product updates such that the product update is locally implemented on the endpoints 106. The update packages may include scripts and/or executables that modify the state of the endpoints 106 to enable installation and implementation of the product updates. Implementation of the product updates at the endpoints 106 include modification to computer code, programming code, or computer-executable instructions of a program that comprise the products 115.

The third-party agent 119 may be included in the distribution server 112 or another computing device associated with the third-party update network 168. For instance, the third-party agent 119 may access information related to the products 115 on the endpoints 106. The third-party agent 119 may be configured to communicate the information such as product metadata related to the products 115 to the management device 102. For instance, on its own or responsive to a request (from the management device 102 or another endpoint 106), the third-party agent 119 may communicate the information related to the first products 115A to the management device 102. The information related to the first products 115A may include a current inventory of the first products 115A as well as information or product metadata related to the first products 115A such as version, vendor, type, hardware integrations, size, privacy policy, software interfaces, and the like.

To implement the third-party update network 168 the endpoints 106 may be enrolled. For instance, the endpoints 106 may be enrolled in update management services implemented by the third-party update network 168. After the endpoints 106 are enrolled, ongoing management of the endpoints 106 may be implemented by the distribution server 112. The ongoing management performed by the distribution server 112 may include control of product updates implemented at the endpoints 106 as described in the present disclosure.

The managed network 110 includes the management device 102 and the endpoints 106. The managed network 110 is implemented to enable management of the endpoints 106 by the management device 102. Part of the management of the endpoints 106 may include supplementing the product updates implemented using the third-party update network 168. For instance, the management device 102 may be configured to create and communicate product updates to the distribution server 112 that would not otherwise be managed by the distribution server 112. Additionally or alternatively, the management device 102 may analyze product inventories communicated to the management device 102 by the third-party agent 119. Based on analysis of the product inventories, the product updates distributed by the distribution server 112 may be altered.

The endpoints 106 may include hardware-based computer systems that are configured to communicate with the other components of the operating environment 100 via the network 120. The endpoints 106 may include any computer device that may be managed by the management device 102 and/or have been enrolled in the managed network 110 and the third-party update network 168. Generally, the endpoints 106 include devices that are operated by the personnel and systems of an enterprise or store data of the enterprise. The endpoints 106 might include workstations of an enterprise, servers, data storage systems, printers, telephones, internet of things (TOT) devices, smart watches, sensors, automobiles, battery charging devices, scanner devices, etc. The endpoints 106 may also include virtual machines, which may include a portion of a single processing unit or one or more portions of multiple processing units, which may be included in multiple machines. The endpoints 106 may be referred to as managed endpoints when the endpoints 106 are included in the managed network 110 or the third-party update network 168.

The endpoints 106 include the products 115. The products 115 may include applications of any kind or type. Some examples of the products 115 may include software applications, enterprise software, operating systems, and the like. The first products 115A may not be the same as the second products 115B. For instance, the first products 115A may include a first set of software applications while the second products 115B may include a second set of software applications which may include at least one software application that is not included in the first set of software applications.

The management device 102 may include a hardware-based computer system that is configured to communicate with the other components of the operating environment 100 via the network 120. The management device 102 may be associated with an administrator 108. The administrator 108 may be an individual, a set of individuals, or a system that interfaces with the management device 102. In some embodiments, the administrator 108 may provide input to the management device 102. The input provided by the administrator 108 may form the basis of some computing processes performed by the management device 102. For example, the administrator 108 may provide user input at a user interface associated with the management device 102. The user input may indicate that the administrator 108 intends on publishing or distributing a subset of recommended product updates. The user input may take the form of a selection of an icon or button on the management device 102.

The management device 102 may include an update management module 116 (in the Figures, "update MGMT module") and a third-party management module 151 (in the Figures, "third-party MGMT module 151"). The update management module 116 and the third-party management module 151 may be configured for automated software management of the endpoints 106. The automated software management may be based on discovery of the products 115 from the third-party agent 119 and improved management based on the discovered products 115.

For example, in some embodiments, the management device 102 may be configured to import update metadata. The update metadata may be consumed from the update lists 117 or may be received as part of an update catalog 111. As described above, the update lists 117 may include cybersecurity vulnerabilities and product updates, which may be related to or pertain to the products 115.

The update management module 116 may generate an initial update list based on the imported update metadata. The initial update list may include one or more outstanding product updates for the endpoints 106. For example, the imported update metadata or the update catalog 111 might include ten entries of recent cybersecurity vulnerabilities and product updates. Responsive to receipt of the imported update metadata, the update management module 116 may generate the initial update list to include product updates related to each of the ten entries.

In some embodiments, the update management module 116 may be configured to import and use vulnerability information related to CVEs, IAVAs, or another suitable update list 117. For instance, the update management module 116 may identify the products that are related to the vulnerability information. The update management module 116 may then use the identified products to at least partially generate the initial update list. For example, the update management module 116 may review the update catalog 111 to find product updates related to the identified products. The found product updates may then be included (e.g., appended to) in the initial update list. Additionally or alternatively, the found product updates may also be used to filter or prioritize the initial update list. In these and other embodiment, the initial update list also be based directly on information of the update catalog 111 without referencing the vulnerability information or may be solely based on the information related to vulnerability information. The initial update list may be communicated to the third-party management module 151 or the third-party management module 151 may generate the initial update list.

The update management module 116 may be configured to discover the products 115 at the endpoints 106. In some embodiments, the update management module 116 may communicate with the third-party agent 119 to discover the products 115 at the endpoint 106. For instance, the update management module 116 may use third-party APIs to access product information gathered by the third-party agent 119.

Without the product information from the third-party agent 119, the management device 102 may have limited knowledge regarding the products 115. Such limited knowledge may further limit an ability to determine suitable product updates for the products 115. In the embodiments described in the present disclosure, the product information provided by the third-party agent 119 includes the application-metadata, which is a broader set of information relative to a binary file, etc. Accordingly, the product information provided in by the third-party agent 119 may be used to accurately identify applicable product updates in the update catalog 111.

The update management module 116 may generate an endpoint-specific inventory. The endpoint-specific inventory may be based on the discovered products and/or the received product information related to the products 115. The endpoint-specific inventory may include the products 115 loaded on the endpoints 106. In some embodiments, the endpoint-specific inventory may relate to one of the endpoints 106 (e.g., may include the first products 115A on the first endpoint 106A). Additionally or alternatively, the endpoint-specific inventory may relate to two or more endpoints 106, which may be a defined group of endpoints 106. For example, the endpoint-specific inventory may include common products 115 in the endpoints 106. Other formats may be implemented for the product-specific inventory to relate the products 115 or subsets thereof that are loaded on the endpoints 106.

The update management module 116 may identify an unnecessary product update from the initial update list. The unnecessary product update is one of the outstanding product updates that does not relate to at least one of the discovered products.

The update management module 116 may filter the unnecessary product update from the initial update list. Filtering the unnecessary product update from the initial update list may remove the unnecessary product update from the initial update list. Filtering the unnecessary product update may generate a modified update list. The modified update list may include a subset of the outstanding product updates and may omit the unnecessary product update. The subset of the outstanding product updates may be presented as "recommended updates" in some embodiments. The update management module 116 may communicate the subset of outstanding product updates of the modified update list to the third-party management module 151.

The third-party management module 151 may cause display of the subset of outstanding product updates to the administrator 108. Automatically or triggered by administrative input, the third-party management module 151 may distribute the subset of outstanding product updates. For instance, the subset of outstanding product updates may be pushed to the distribution server 112 such that the endpoints 106 may access the subset of outstanding product updates at the distribution server 112. The outstanding product updates may be received at the endpoints 106 and may be incorporated into one or more of the products 115. For instance, the subset of outstanding product updates may modify the program codes of one or more of the products 115.

The update management module 116 may be further configured to maintain and actively manage updates related to the products 115 on the endpoints 106. For instance, the update management module 116 may rediscover the products 115 on the endpoints 106. When the products 115 are rediscovered, the update management module 116 may determine whether there has been changes to the products 115. Responsive to a change (e.g., an additional product or a removed product), the modified update list may be further modified to either add additional product updates or filter product updates consistent with the products 115 on the endpoints 106. An example of the active management of updates on the endpoints 106 is described in U.S. application Ser. No. 17/508,748, which is incorporated herein by reference in its entirety.

The third-party agent 119, the update management module 116, the third-party management module 151, the products 115, and components thereof may be implemented using hardware including a processor, a microprocessor (e.g., to perform or control performance of one or more operations), a field-programmable gate array (FPGA), or an application-specific integrated circuit (ASIC). In some other instances, the third-party agent 119, the update management module 116, the third-party management module 151, the products 115, and components thereof may be implemented using a combination of hardware and software. Implementation in software may include rapid activation and deactivation of one or more transistors or transistor elements such as may be included in hardware of a computing system (e.g., the endpoints 106 or the management device 102 of FIG. 1). Additionally, software defined instructions may operate on information within transistor elements. Implementation of software instructions may at least temporarily reconfigure electronic pathways and transform computing hardware.

The managed network 110 may be associated with an enterprise, a portion of an enterprise, a government entity, or another entity or set of devices (102, 113, 106, or 112). In some embodiments, the management device 102 may be a single server, a set of servers, a virtual device, or a virtual server in a cloud-base network of servers. In these and other embodiments, the update management module 116 may be spread over two or more cores, which may be virtualized across multiple physical machines.

Modifications, additions, or omissions may be made to the operating environment 100 without departing from the scope of the present disclosure. For example, the operating environment 100 may include one or more managed networks 110, one or more third-party update networks 168, one or more management devices 102, one or more support devices 113, one or more endpoints 106, one or more update servers 104, one or more distribution servers 112, or any combination thereof. Moreover, the separation of various components and devices in the embodiments described herein is not meant to indicate that the separation occurs in all embodiments. Moreover, it may be understood with the benefit of this disclosure that the described components and servers may generally be integrated together in a single component or server or separated into multiple components or servers.

Figure 2:
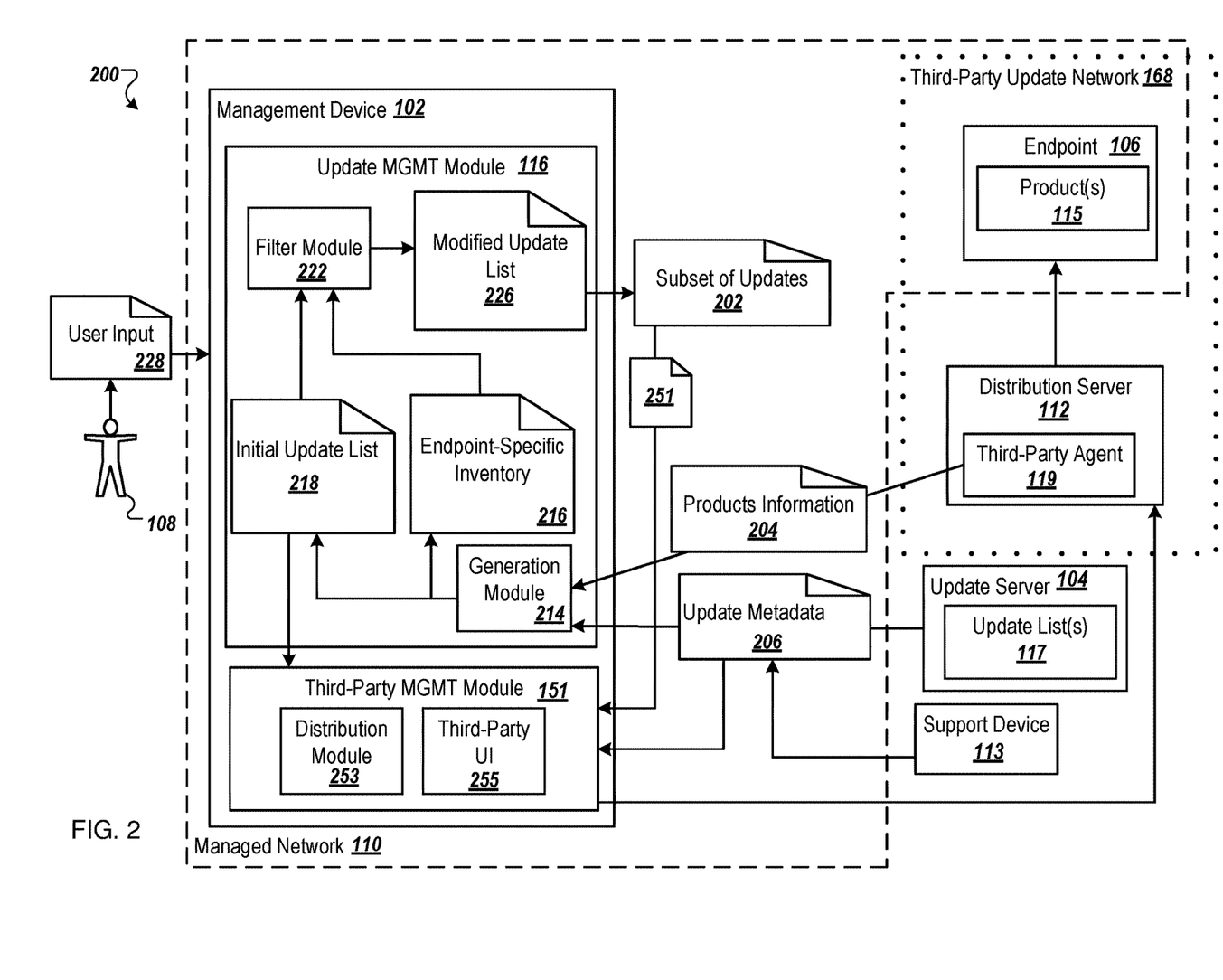
FIG. 2 depicts a block diagram of an example automated software management process that may be implemented in the operating environment of FIG. 1.

FIG. 2 depicts a block diagram of an example automated software management process (management process) 200 that may be implemented in the operating environment 100 of FIG. 1 or another suitable environment. The management process 200 of FIG. 2 may include one or more components (e.g., 102, 104, 106, 108, 110, 111, 168, 112, 113, 117, 115, 116, and 119) described with reference to FIG. 1. Although not depicted in FIG. 2, communication in the management process 200 may be via a network such as the network 120 of FIG. 1.

In the management process 200, update metadata 206 may be imported by the management device 102. The update metadata 206 may be imported from one or both of the update server 104 and the support device 113. For instance, update server 104 may be a server of an entity that publishes bulletins including the update metadata 206. The management device 102 may download the update metadata 206 from the update server 104. Additionally or alternatively, the support device 113 may review the bulletins of the update server 104. Based on the review, administrators of the support device 113 may communicate the update metadata 206 to the management device 102 or include the update metadata 206 in an update catalog 111.

The update metadata 206 may include data that describes characteristics of one or more product updates. For instance, the update metadata 206 may include an identifier or name of the product updates, dates of the bulletins, security level of the product updates, urgency of the product updates, threat level of the product updates, vendors of the product updates, applicable programs of the product updates, combinations thereof, or other data describing characteristics of the product updates.

The update metadata 206 may be processed by the update management module 116 and the third-party management module 151. For instance, the update metadata 206 or some portion thereof may be entered into a data storage architecture, which may make the update metadata 206 accessible to the update management module 116, the third-party management module 151, or administrator 108 thereof. The update metadata 206 may include vulnerability information that is related to known vulnerabilities. For instance, the update metadata 206 may include vulnerability information from CVEs, IAVAs, etc.

After the import of the update metadata 206, a generation module 214 of the update management module 116 may generate an initial update list 218. The initial update list 218 may be communicated to the third-party management module 151. The initial update list 218 includes outstanding product updates that are identified in the update metadata 206. In some embodiments, the initial update list 218 might include all or substantially the outstanding product updates that are related to endpoints 106 of the managed network 110 or the third-party update network 168. Additionally or alternatively, the initial update list 218 may include product updates that are relevant to products to which CVEs IAVAs, or other published vulnerabilities pertain. For instance, the generation module 214 may identify the products that are related to the CVEs (or IAVAs or another suitable list of vulnerabilities). The generation module 214 may identify product updates from the update catalog 111 that are relevant to the identified products. The generation module 214 may generate the initial update list 218 based at least partially on these product updates.

The initial update list 218 may be displayed to the administrator 108 in some embodiments. For instance, the initial update list 218 may be displayed in a third-party user interface (UI) 255. Display of the initial update list 218 may provide some patch management insight, which may be valuable to the administrator 108. Additionally, the initial update list 218 may be communicated to a filter module 222 and may represent an overly inclusive list of product updates that may or may not be related to the products 115 of the endpoint 106.

The generation module 214 may be configured to discover products 115 at the endpoint 106. With combined reference to FIGS. 1 and 2, the generation module 214 may be configured to discover the products 115 on each or all of the endpoints 106 of the managed network 110 and the third-party update network 168.

Referring back to FIG. 2, the generation module 214 may be configured to communicate with the third-party agent 119 of the third-party update network 168. The third-party agent 119 may access and track information related to the products 115 on the endpoint 106. In some embodiments, the third-party agent 119 may be configured to discover the products 115 direction of a third-party entity.

The third-party agent 119 may communicate products information 204 regarding the products 115 loaded on the endpoint 106. The products information 204 may indicate the current products 115 loaded on the endpoints 106 and product metadata related to the current products 115. For instance, if a user of the endpoint 106 downloaded an application without permission or authorization of the administrator 108, the discovery operation of the third-party agent 119 may uncover the presence of the application on the endpoint 106. In some embodiments, the generation module 214 may perform a discovery operation responsive to receipt of the update metadata 206. Additionally or alternatively, the generation module 214 implement the discovery operation periodically or according to a schedule (e.g., every day or every week). For example, the generation module 214 may implement a third-party API to access the product information 204 from the third-party agent 119. For instance, in these and other embodiments, the third-party update network includes Microsoft Intune and the third-party API includes Microsoft Graph API.

The generation module 214 may receive the product information 204 that includes product metadata of the products 115. The generation module 214 may be configured to generate an endpoint-specific inventory 216 based on the product information 204. The endpoint-specific inventory 216 includes information related to the products 115 on the endpoint 106. For instance, the endpoint-specific inventory 216 may include a product name, a version, a vendor, and the like of the products.

In some embodiments, the endpoint-specific inventory 216 may include an inventory of two or more endpoints 106. In particular, the endpoint-specific inventory 216 may include the inventory of a group of endpoints or a subnet of the managed network 110. The endpoint-specific inventory 216 may be communicated to the filter module 222.

The filter module 222 may be configured to identify an unnecessary product update in the initial update list 218. The unnecessary product update may include one of the outstanding product updates of the initial update list 218 that is not related to at least one of the products 115 of the endpoint-specific inventory 216. In some embodiments, the filter module 222 may base the identification of the unnecessary product update on a comparison of data and information in the initial update list 218 with the data and information in the endpoint-specific inventory 216. For instance, the initial update list 218 might include three (3) product updates that are related to a first product, a second product, and a third product. The endpoint-specific inventory may list the products 115 of the endpoint 106 to include the first product and the third product. Accordingly, the filter might identify that the product update related to the second product is unnecessary.

The filter module 222 may filter the unnecessary product update from the initial update list 218. By filtering the unnecessary product update, the filter module 222 may generate a modified update list 226. The modified update list 226 may include a subset of the outstanding product updates of the initial update list 218 and may omit the unnecessary product updates.

The update management module 116 may be configured to communicate a subset of outstanding product updates (hereinafter, "subset of updates") 202 to the third-party management module 151. The subset of updates 202 may be displayed to the administrator 108 on the third-party UI 255.

The distribution module 253 may be configured to distribute the subset of updates 202 to the endpoint 106 via the distribution server 112 or otherwise take actions to communicate the subset of updates 202 to the endpoint 106. In some embodiments, the distribution may include communication of the subset of updates 202 indirectly to the endpoint 106. For instance, the subset of updates 202 may be published to the distribution server 112. The endpoint 106 may then access the subset of updates 202 from the distribution server 112.

Distribution of the subset of updates 202 enable local implementation at the endpoint 106. Implementation of the subset of updates 202 may include code changes that are executed or incorporated at the product 115. The distributed subset of updates 202 modifies a portion of a code that makes up the application such that at least one functionality of the application changes following implementation.

The distribution may include only the subset of updates 202. For example, the unnecessary product updates may not be distributed. Accordingly, implementation of the management process 200 may improve the efficiency of patch management in the managed network 110 and the third-party update network 168.

In some embodiments, distributing only the subset of outstanding product updates occurs automatically. For instance, the distribution module 253 may automatically distribute and/or publish the subset of updates 202. The distribution module 253 may automatically distribute and/or publish the subset of updates 202 to the distribution server 112 for instance. The distribution module 253 may automatically distribute and/or publish the subset of updates 202 responsive to indications of matches between the product updates in the initial update list 218 and products in the endpoint-specific inventory 216.

Additionally or alternatively, the distribution module 253 may be configured to manually publish and distribute the subset of updates 202. For instance, the distribution module 253 may be configured to cause display of the modified update list 226 in the third-party UI 255.

The third-party UI 255 may be configured to receive user input 228. For instance, the third-party UI 255 may include an icon or electronic button configured to receive the user input 228 and in response the distribution module 253 may distribute the subset of updates 202. As described elsewhere in the present disclosure, distribution (manual and automatic) may include publication to the distribution server 112.

In some embodiments, the update management module 116 may be configured to identify an unsupported product in the initial update list 218 and in the endpoint-specific inventory 216. For instance, the unsupported product may not be updated by the third-party update network 168. For instance, the third-party update network 168 may only be configured to manage product updates from particular vendors and may not support product updates from other vendors. An example is Adobe® product updates in Intune.

The update management module 116 may generate an update package 251 for the unsupported product. The update package 251 may include a product update along with data and information necessary for distribution by the distribution server 112. The update management module 116 may communicate the update package 251 to the third-party management module 151 where it may be displayed on the third-party UI 255. The distribution module 253 may distribute the update package 251 for the unsupported product to the endpoint 106 via the third-party update network 168 using the distribution server 112.

Additionally, in some embodiments, the update management module 116 may be configured to provide additional supplemental information to the third-party management module 151. For instance, the initial update list 218 may include one or more outstanding product updates for the endpoint 106 as well as one or more outstanding product updates for additional managed endpoints of the managed network 110 and the third-party update network 168. In these and other embodiments, the update management module 116 may receive additional product metadata from the third-party agent 119 related to the additional managed endpoints. Based on the initial update lists and the additional product metadata, the update management module 116 may identify a subset of the additional endpoints that are missing at least one of the outstanding product updates. The subset of the additional endpoints may be communicated to the third-party management module 151, where it may be displayed on the third-party UI 255. The subset of the additional endpoints may enable the administrator 108 to prioritize deployment and additional remediation.

The management process 200 or some operations included therein may be implemented for two or more endpoints 106. The management process 200 may be implemented individually for each endpoint 106 or may be implemented for a group of endpoints 106. The update management module 116 may discover the products 115 of each endpoint 106 or each group of endpoints 106. The product updates (e.g., the subset of update 202) applicable to the discovered products may be distributed.

The management process 200 may be repeated. For instance, each time a bulletin is published or the update catalog 111 is updated, the management process 200 may be performed. Additionally, the management process 200 may be performed when the managed network 110 is changed. For instance, the management process 200 may be performed responsive to one or more added endpoints 106, one or more removed endpoints 106, one or more changed products 115, reconfiguring groups of endpoints 106, and the like.

Figure 3:
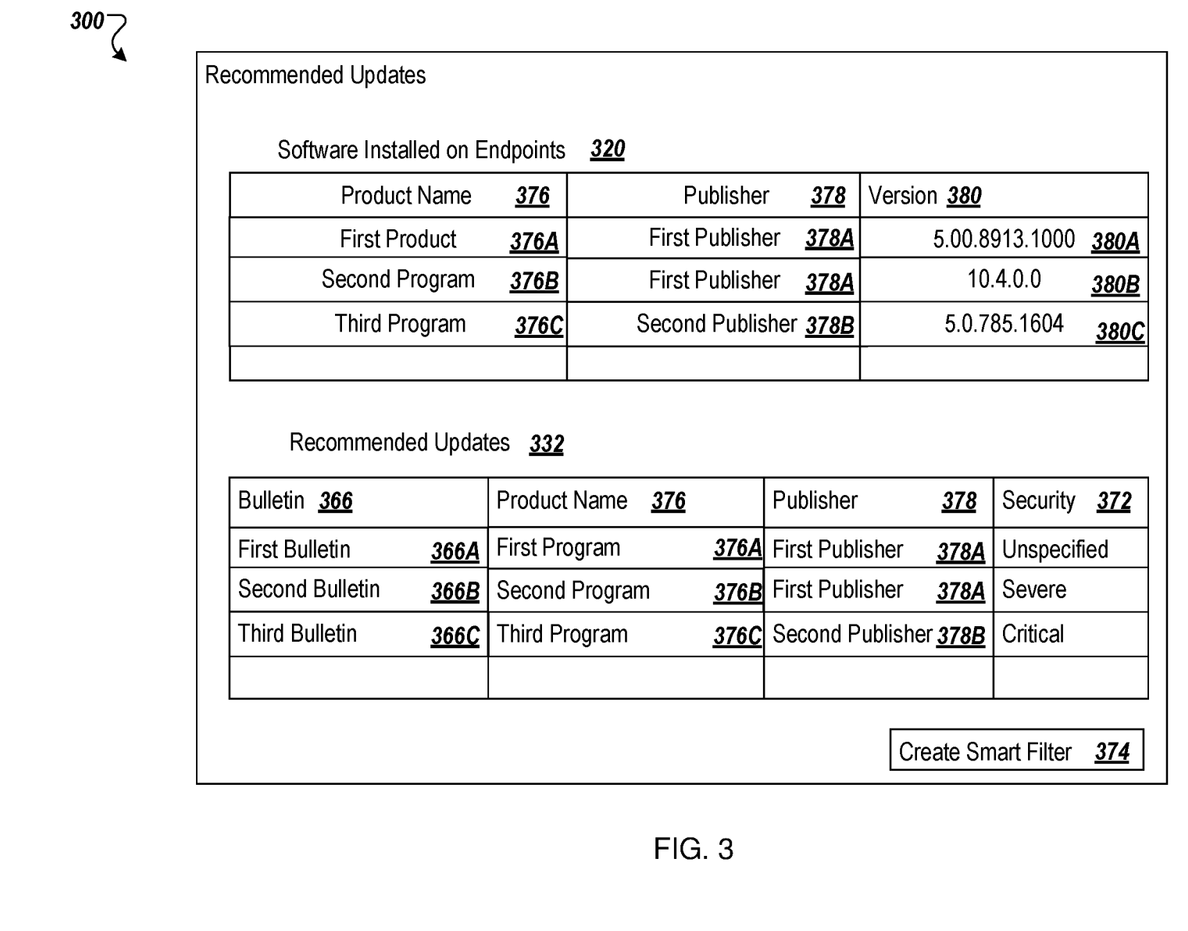
FIG. 3 depicts an example recommended update user interface that may be implemented in the automated software management process of FIG. 2.

FIG. 3 is a block diagram of an example recommended update user interface (recommendation interface) 300 that may be implemented in the operating environment 100 or another suitable operating environment. The recommendation interface 300 may be displayed on the third-party UI 255. For instance, the recommendation interface 300 may be displayed as a result of selection of the recommend updates button.

The recommendation interface 300 may be configured to display products on endpoints, recommended product updates related to the products, and enable application of a filter operation. The recommendation interface 300 includes an upper portion 320 on which data and information related to products on one or more endpoints are displayed. In the depicted embodiment, the products are referred to as software or products. The data and information displayed in the upper portion 320 are representative information discovered on endpoints that are communicatively connected to a computing device on which the recommendation interface 300 is displayed. The upper portion 320 may be an example of an endpoint-specific inventory such as the endpoint-specific inventory 216 described elsewhere in the present disclosure.

In the depicted recommendation interface 300, information regarding the products is displayed in a table. The table may include two or more columns of data such as a product name column 376, a publisher column 378, and a version column 380. The product name column 376 displays a product name for each product on the endpoints. In the displayed recommendation interface 300, the product names are given as first product 376A, second product 376B, and third product 376C. The publisher column 378 indicates a vendor or an entity that sells or otherwise offers the product. A single publisher may sell or offer two or more of the products. The version column 380 indicates a version of the product currently loaded on the endpoints.

The recommendation interface 300 includes a lower portion 332 on which recommended updates are listed. The recommended updates in the lower portion 332 may be an example of a modified update list such as the modified update list 226 described elsewhere in the present disclosure. The recommended updates may also correspond to and may be substantially similar to product updates included in the subset of updates 202 described with reference to FIG. 2.

In the depicted recommendation interface 300, information regarding the recommended updates is displayed in a table. The table may include two or more columns of data such as a bulletin column 366, the product name column 376, and the publisher column 378, and a security column 372. The bulletin column 366 includes the name of the bulletin that includes the recommended update. The product name column 376 and the publisher column 378 are as described in the upper portion 320. The security column 372 includes information regarding a level of risk associated with the recommended update. In some circumstances, knowledge of the level of risk may influence a decision to distribute the recommended update. For instance, critical product updates might be distributed automatically while unspecified product updates may be manually distributed.

The depicted recommendation interface 300 includes a "create smart filter" button 374. The button 374 allows the administrator to refine or filter the recommended updates based on one or more criteria. For instance, the recommended updates displayed in the lower portion 332 may be a result of a filter based on a presence of a corresponding product on the endpoint. That is, for a first bulletin to be included in the recommended updates, the first program to which it applies must be included on the endpoints. Additional filters are possible, for instance, the bulletins may be filtered based on products, publisher, security/risk level, version, other criteria, or combinations thereof.

Figure 4:
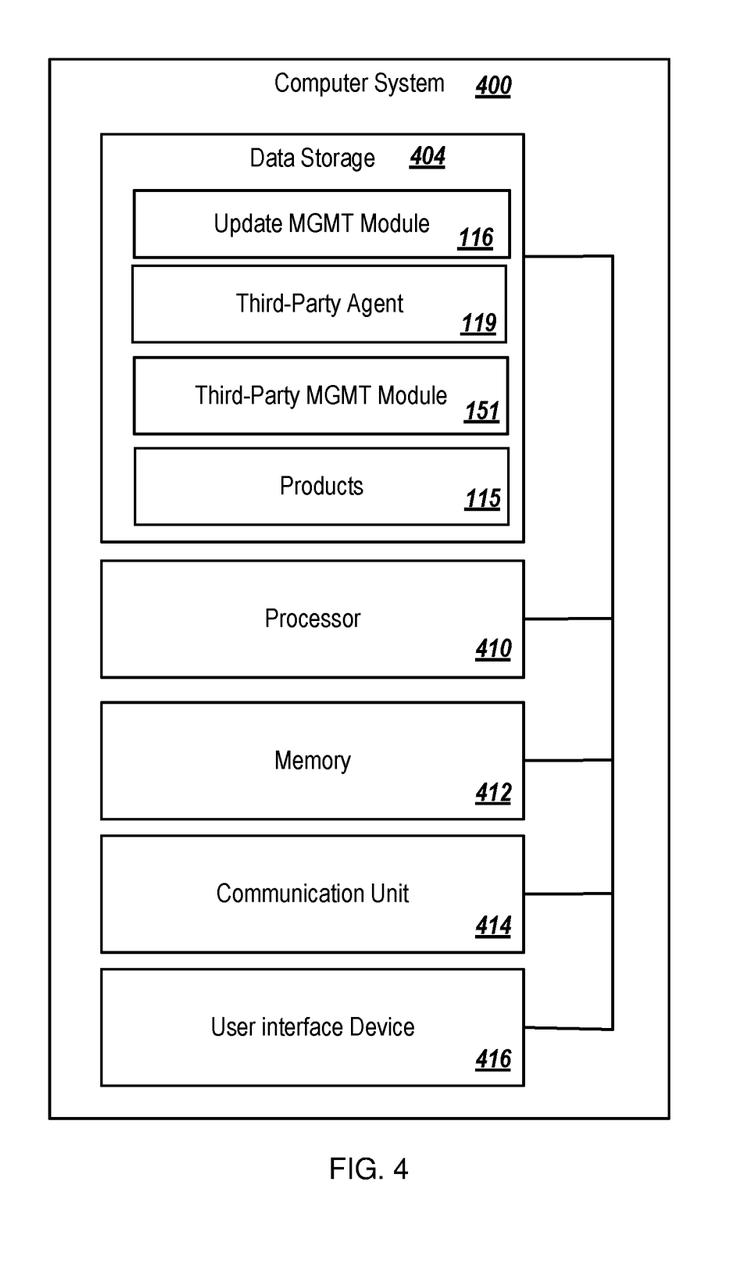
FIG. 4 illustrates an example computer system configured for automated software management.

FIG. 4 illustrates an example computer system 400 configured for automated software management, according to at least one embodiment of the present disclosure. The computer system 400 may be implemented in the operating environment 100 FIG. 1, for instance. Examples of the computer system 400 may include the management device 102, one or more of the endpoints 106, the update server 104, the support device 113, the distribution server 112, or some combination thereof. The computer system 400 may include one or more processors 410, a memory 412, a communication unit 414, a user interface device 416, and a data storage 404 that includes the update management module 116, the third-party management module 151, the products 115, and the third-party agent 119 (collectively, "update modules").

The processor 410 may include any suitable special-purpose or general-purpose computer, computing entity, or processing device including various computer hardware or software modules and may be configured to execute instructions stored on any applicable computer-readable storage media. For example, the processor 410 may include a microprocessor, a microcontroller, a digital signal processor (DSP), an ASIC, an FPGA, or any other digital or analog circuitry configured to interpret and/or to execute program instructions and/or to process data. Although illustrated as a single processor in FIG. 4, the processor 410 may more generally include any number of processors configured to perform individually or collectively any number of operations described in the present disclosure. Additionally, one or more of the processors 410 may be present on one or more different electronic devices or computing systems. In some embodiments, the processor 410 may interpret and/or execute program instructions and/or process data stored in the memory 412, the data storage 404, or the memory 412 and the data storage 404. In some embodiments, the processor 410 may fetch program instructions from the data storage 404 and load the program instructions in the memory 412. After the program instructions are loaded into the memory 412, the processor 410 may execute the program instructions.

The memory 412 and the data storage 404 may include computer-readable storage media for carrying or having computer-executable instructions or data structures stored thereon. Such computer-readable storage media may include any available media that may be accessed by a general-purpose or special-purpose computer, such as the processor 410. By way of example, and not limitation, such computer-readable storage media may include tangible or non-transitory computer-readable storage media including RAM, ROM, EEPROM, CD-ROM or other optical disk storage, magnetic disk storage or other magnetic storage devices, flash memory devices (e.g., solid state memory devices), or any other storage medium which may be used to carry or store desired program code in the form of computer-executable instructions or data structures and that may be accessed by a general-purpose or special-purpose computer. Combinations of the above may also be included within the scope of computer-readable storage media. Computer-executable instructions may include, for example, instructions and data configured to cause the processor 410 to perform a certain operation or group of operations.

The communication unit 414 may include one or more pieces of hardware configured to receive and send communications. In some embodiments, the communication unit 414 may include one or more of an antenna, a wired port, and modulation/demodulation hardware, among other communication hardware devices. In particular, the communication unit 414 may be configured to receive a communication from outside the computer system 400 and to present the communication to the processor 410 or to send a communication from the processor 410 to another device or network (e.g., the network 120 of FIG. 1).

The user interface device 416 may include one or more pieces of hardware configured to receive input from and/or provide output to a user. In some embodiments, the user interface device 416 may include one or more of a speaker, a microphone, a display, a keyboard, a touch screen, or a holographic projection, among other hardware devices.

The update modules may include program instructions stored in the data storage 404. The processor 410 may be configured to load the update modules into the memory 412 and execute the update modules. Alternatively, the processor 410 may execute the update modules line-by-line from the data storage 404 without loading them into the memory 412. When executing the update modules, the processor 410 may be configured to perform one or more processes or operations described elsewhere in this disclosure.

Modifications, additions, or omissions may be made to the computer system 400 without departing from the scope of the present disclosure. For example, in some embodiments, the computer system 400 may not include the user interface device 416. In some embodiments, the different components of the computer system 400 may be physically separate and may be communicatively coupled via any suitable mechanism. For example, the data storage 404 may be part of a storage device that is separate from a device, which includes the processor 410, the memory 412, and the communication unit 414, that is communicatively coupled to the storage device. The embodiments described herein may include the use of a special-purpose or general-purpose computer including various computer hardware or software modules, as discussed in greater detail below.

Figure 5A:
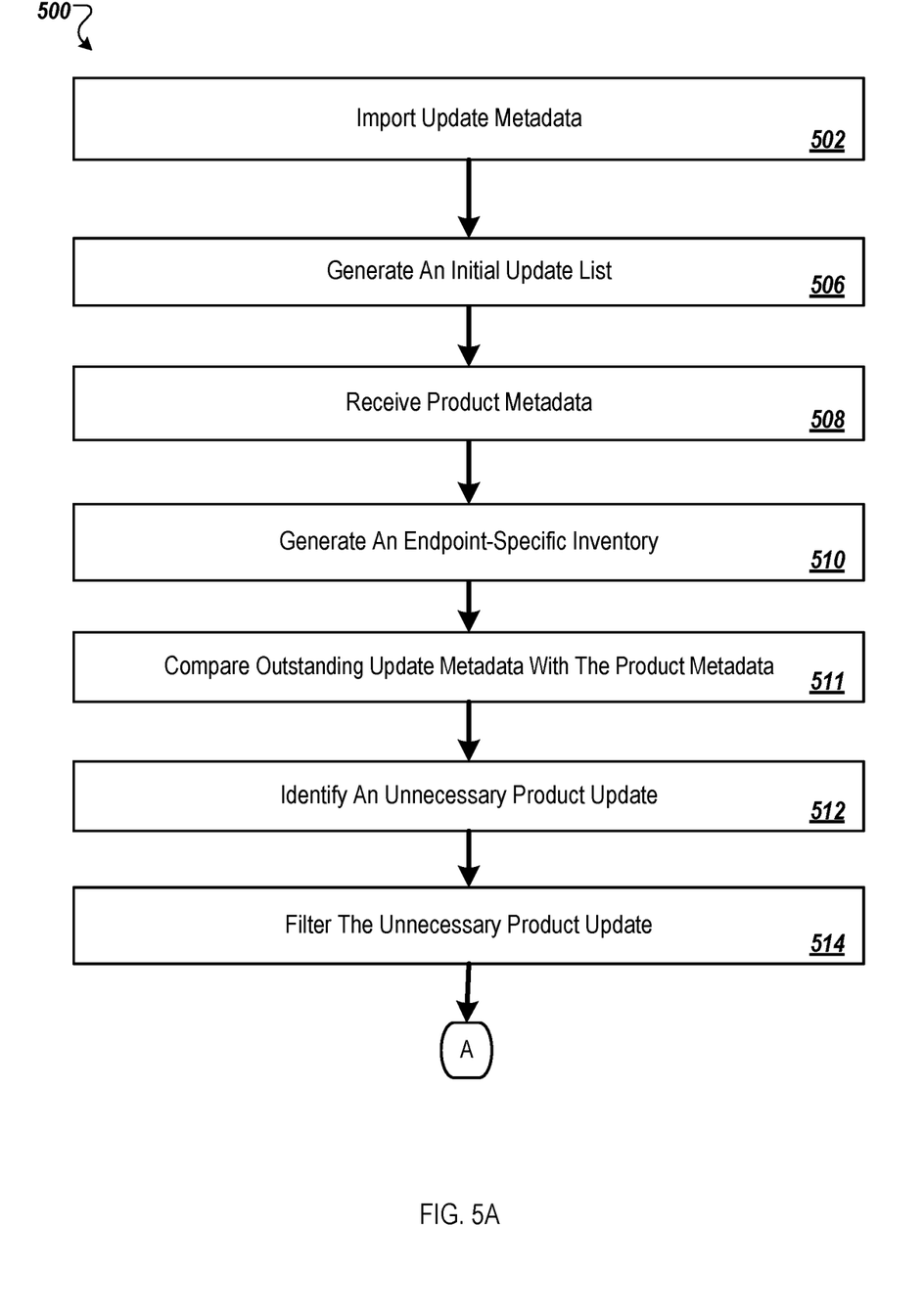
FIGS. 5A and 5B are a flow chart of an example method of automated software management, all according to at least one embodiment described in the present disclosure.
Figure 5B:
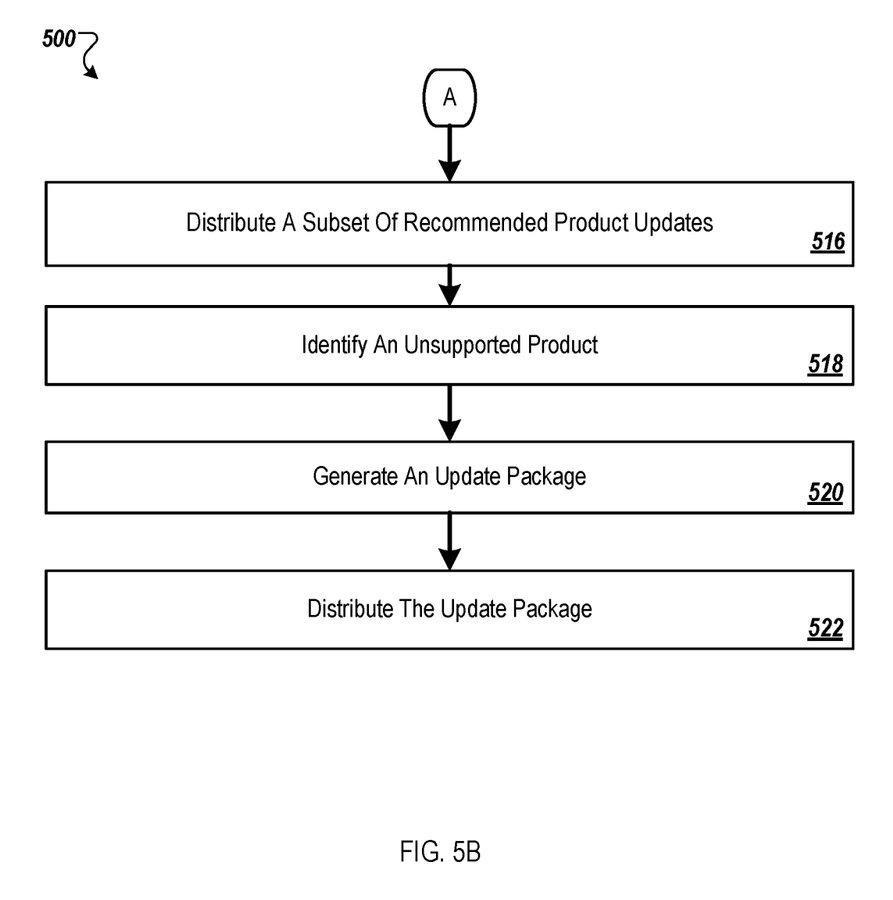

FIGS. 5A and 5B is a flow chart of an example method 500 of automated software management, according to at least one embodiment of the present disclosure. As described elsewhere in the present disclosure, the method 500 may involve or may be based on metadata imported from update lists and product inventories of a managed endpoint and product metadata provided by a third-party agent.

The method 500 may be performed in a suitable operating environment such as the operating environment 100 of FIG. 1. The method 500 may be performed by the management device 102 described elsewhere in the present disclosure or by another suitable computing system, such as the computer system 400 of FIG. 4. In some embodiments, the management device 102 or the other computing system may include or may be communicatively coupled to a non-transitory computer-readable medium (e.g., the memory 412 of FIG. 4) having stored thereon programming code or instructions that are executable by one or more processors (such as the processor 410 of FIG. 4) to cause a computing system or the management device 102 to perform or control performance of the method 500. Additionally or alternatively, the management device 102 may include the processor 410 that is configured to execute computer instructions to cause the management device 102 or another computing systems to perform or control performance of the method 500. The management device 102 or the computer system 400 implementing the method 500 may be included in a cloud-based managed network, an on-premises system, or another suitable network computing environment. Although illustrated as discrete blocks, one or more blocks in FIGS. 5A and 5B may be divided into additional blocks, combined into fewer blocks, or eliminated, depending on the desired implementation.

Referring to FIG. 5A, the method 500 may begin at block 502, in which update metadata may be imported. The update metadata may be consumed from an update list. The update list may include information related to cybersecurity, patches, updated application versions, or combinations thereof. For instance, the update list may include a publicly available list of cybersecurity vulnerabilities and product updates. The update list may include data and metadata related to one or more of the cybersecurity vulnerabilities and product updates. For instance, the update list may include an identification number, a description, a public reference, a link to a patch or update, or some combination thereof for at least some of the cybersecurity vulnerabilities and product updates.

The update metadata may be consumed by operations performed at a support device. For instance, update metadata may include appending or adding the update metadata to an update catalog. The update catalog may include records information associated with previous product updates and/or previous cybersecurity vulnerabilities.

At block 506, an initial update list may be generated. The initial update list may be based on the imported update metadata and/or other information related to the update list or the update catalog. The initial update list may include multiple outstanding product updates for one or more endpoints included in a managed network. The outstanding product updates might include new versions of products, patches, code changes, configuration modifications, combinations thereof, or other suitable product updates that may be implemented by the endpoints to modify a code or a setting of the product.

In some embodiments, generation of the initial update list may be based at least partially on information imported from CVEs, IAVAs, or other published vulnerability information. Products that are related to the vulnerability information may be identified. The identified products may be used to review or search product updates in update catalog. Product updates associated with the identified products may be used to generate or supplement the initial update list.

At block 508, product metadata may be received. The product metadata may be received from a third-party agent. The product metadata may be related to products loaded on the managed endpoint. In some embodiments, the third-party agent being configured to discover the products. In addition, the third-party agent may be configured to discover the products under direction of a third-party entity. In some embodiments, a third-party API may be implemented to access the discovered products from the third-party agent. In these and other embodiments, the third-party API includes Microsoft Graph API and the third-party update network includes Microsoft Intune.

At block 510, an endpoint-specific inventory may be generated. The endpoint-specific inventory may be generated based on the product metadata of the discovered products. The endpoint-specific inventory may be indicative of the products loaded on the managed endpoint. At block 511, the outstanding update metadata may be compared with the product metadata. For instance, the outstanding update metadata of the initial update list may be compared to the product metadata of the endpoint-specific inventory.

At block 512, an unnecessary product update may be identified. The unnecessary product update may be based on the comparison between the outstanding update metadata and the product metadata. The unnecessary product update may include one of the outstanding product updates that is not be related to at least one of the discovered products. At block 514, the unnecessary product update may be filtered. The unnecessary product update may be filtered from the initial update list. Filtering the unnecessary product update from the initial update list may remove the identified unnecessary product update from the initial update list. In some embodiments, the filtering involves a comparison between the update metadata associated consumed information and the product metadata of the endpoint-specific inventory. Filtering the unnecessary product update may result in generation of a modified update list. The modified update list may include a subset of outstanding product updates of the initial update list and omit the filtered unnecessary product update.

Referring to FIG. 5B, at block 516, the subset of outstanding product updates may be distributed. For instance, only the subset of the outstanding product updates may be distributed of the modified update list. The filtered unnecessary product update may not be distributed to the managed endpoint. Accordingly, the managed endpoint may not receive product updates that are not related to the products currently loaded on the managed endpoint.

Distribution of the subset of outstanding product updates may enable the product updates to be incorporated into or loaded in the products on the managed endpoint. The incorporation of the product updates modifies the products such that the managed endpoint operates in a different way following incorporation.

In some embodiments, the method 500 may include causing display of the modified update list in a user interface. User input may be received at the user interface. The user input may be sufficient to publish the subset of outstanding product updates to a distribution server.

In these and other embodiments, the distributing the subset of outstanding product updates of block 516 may be responsive to the managed endpoint accessing the published product updates at the distribution server. In some embodiments, the distributing of block 516 occurs automatically such as according to a schedule or patch policy. Additionally, in some embodiments, the distributing of block 516 may be both responsive to received user input and automatically. For instance, an administrator may establish an automatic distribution process that occurs according to a schedule or patch policy. In addition, the administrator may review one or more of the outstanding product updates and provide user input suitable to initiate distribution or publication of one or more of the outstanding product updates.

At block 518, an unsupported product may be identified. The unsupported product may be identified in the initial update list and in the endpoint-specific inventory. In some embodiments, the unsupported product is not updated by the third-party update network. At block 520, an update package may be generated. The update package may be generated for the unsupported product. At block 522, the update package may be distributed. The update package may be distributed for the unsupported product to the endpoint via the third-party update network.

Further, modifications, additions, or omissions may be made to the method 500 without departing from the scope of the present disclosure. For example, the operations of method 500 may be implemented in differing order. Furthermore, the outlined operations and actions are only provided as examples, and some of the operations and actions may be optional, combined into fewer operations and actions, or expanded into additional operations and actions without detracting from the disclosed embodiments.

For instance, in some embodiments, the initial update list includes one or more outstanding product updates for the managed endpoint as well as one or more outstanding product updates for additional managed endpoints of the managed network and the third-party update network. In these and other embodiments, the method 500 may comprise receiving additional product metadata from the third-party agent related to the additional managed endpoints. Additionally, the method may include identifying a subset of the additional endpoints that are missing at least one of the outstanding product updates based on the initial update lists and the additional product metadata.

Additionally, the method 500 may include management new products, new policies, removal of products, on managed endpoints. Example of these processes are described in U.S. application Ser. No. 17/508,748, which is incorporated herein by reference in its entirety.

The embodiments described herein may include the use of a special purpose or general-purpose computer including various computer hardware or software modules, as discussed in greater detail below.

Embodiments described herein may be implemented using computer-readable media for carrying or having computer-executable instructions or data structures stored thereon. Such computer-readable media may be any available media that may be accessed by a general purpose or special purpose computer. By way of example, and not limitation, such computer-readable media may include non-transitory computer-readable storage media including Random Access Memory (RAM), Read-Only Memory (ROM), Electrically Erasable Programmable Read-Only Memory (EEPROM), Compact Disc Read-Only Memory (CD-ROM) or other optical disk storage, magnetic disk storage or other magnetic storage devices, flash memory devices (e.g., solid state memory devices), or any other storage medium which may be used to carry or store desired program code in the form of computer-executable instructions or data structures and which may be accessed by a general purpose or special purpose computer. Combinations of the above may also be included within the scope of computer-readable media.

Computer-executable instructions may include, for example, instructions and data, which cause a general-purpose computer, special purpose computer, or special purpose processing device (e.g., one or more processors) to perform a certain function or group of functions. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

As used herein, the terms "module" or "component" may refer to specific hardware implementations configured to perform the operations of the module or component and/or software objects or software routines that may be stored on and/or executed by general purpose hardware (e.g., computer-readable media, processing devices, etc.) of the computing system. In some embodiments, the different components, modules, engines, and services described herein may be implemented as objects or processes that execute on the computing system (e.g., as separate threads). While some of the system and methods described herein are generally described as being implemented in software (stored on and/or executed by general purpose hardware), specific hardware implementations or a combination of software and specific hardware implementations are also possible and contemplated. In this description, a "computing entity" may be any computing system as previously defined herein, or any module or combination of modulates running on a computing system.

The various features illustrated in the drawings may not be drawn to scale. The illustrations presented in the present disclosure are not meant to be actual views of any particular apparatus (e.g., device, system, etc.) or method, but are representations employed to describe embodiments of the disclosure. Accordingly, the dimensions of the features may be expanded or reduced for clarity. In addition, some of the drawings may be simplified for clarity. Thus, the drawings may not depict all of the components of a given apparatus (e.g., device) or all operations of a particular method.

Terms used in the present disclosure and the claims (e.g., bodies of the appended claims) are intended as "open" terms (e.g., the term "including" should be interpreted as "including, but not limited to," the term "having" should be interpreted as "having at least," the term "includes" should be interpreted as "includes, but is not limited to," among others). Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations.

In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in instances in which a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc. Further, any disjunctive word or phrase presenting two or more alternative terms should be understood to contemplate the possibilities of including one of the terms, either of the terms, or both terms. For example, the phrase "A or B" should be understood to include the possibilities of "A" or "B" or "A and B."

However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations.

The terms "first," "second," "third," etc., are not necessarily used to connote a specific order or number of elements. Generally, the terms "first," "second," "third," etc., are used to distinguish between different elements as generic identifiers. Absence a showing that the terms "first," "second," "third," etc., connote a specific order, these terms should not be understood to connote a specific order. Furthermore, absence a showing that the terms "first," "second," "third," etc., connote a specific number of elements, these terms should not be understood to connote a specific number of elements. For example, a first widget may be described as having a first side and a second widget may be described as having a second side. The use of the term "second side" with respect to the second widget may be to distinguish such side of the second widget from the "first side" of the first widget and not to connote that the second widget has two sides.

All examples and conditional language recited herein are intended for pedagogical objects to aid the reader in understanding the invention and the concepts contributed by the inventor to furthering the art and are to be construed as being without limitation to such specifically recited examples and conditions. Although embodiments of the present inventions have been described in detail, it should be understood that the various changes, substitutions, and alterations could be made hereto without departing from the scope of the invention.

What is claimed:

1. A method of automated software management of a managed endpoint, the method comprising:
    generating, by a management device, an initial update list that includes outstanding product updates for a managed endpoint included in a managed network and in a third-party update network, wherein the management device includes a hardware-based computer system that is configured to communicate with a distribution server and the managed endpoint via a communication network;
    receiving, at the management device and from a third-party agent of the distribution server, product metadata related to products loaded on the managed endpoint, the third-party agent being configured to discover the products;
    based on discovered products, generating, by the management device, an endpoint-specific inventory that includes product metadata of the products loaded on the managed endpoint;
    comparing, by the management device, the outstanding update metadata of the initial update list with the product metadata of the endpoint-specific inventory;
    based on the comparison, identifying, by the management device, an unnecessary product update, the unnecessary product update including one of the outstanding product updates that is not related to at least one of the discovered products;
    filtering, by the management device, the unnecessary product update from the initial update list to generate a modified update list, the modified update list including a subset of the outstanding product updates and omitting the unnecessary product update; and
    distributing, by the management device via the communication network, only the subset of the outstanding product updates of the modified update list to the managed endpoint such that the outstanding product updates are received by the managed endpoint and implemented locally on the managed endpoint to modify a program code or a setting of at least one of the discovered products at the managed endpoint.

2. The method of claim 1, further comprising importing update metadata from an update catalog that describes cybersecurity vulnerabilities and product updates, wherein the initial update list is based on imported update metadata.

3. The method of claim 1, wherein the generating the initial update list includes:
    importing vulnerability information common vulnerabilities and exposures (CVEs) or information assurance vulnerability alerts (IAVAs);
    identifying one or more products that are related to the vulnerability information;
    reviewing the update metadata to identify product updates related to the identified products; and
    appending the identified product updates to the initial update list.

4. The method of claim 1, further comprising implementing a third-party API to access the discovered products from the third-party agent.

5. The method of claim 4, wherein:
    the third-party API includes Microsoft Graph API; and
    the third-party update network includes Microsoft Intune.

6. The method of claim 1, wherein the initial update list includes one or more outstanding product updates for the managed endpoint as well as one or more outstanding product updates for additional managed endpoints of the managed network and the third-party update network.

7. The method of claim 6, further comprising:
    receiving additional product metadata from the third-party agent related to the additional managed endpoints; and
    based on the initial update lists and the additional product metadata, identifying a subset of the additional endpoints that are missing at least one of the outstanding product updates.

8. The method of claim 1, wherein the distributing only the subset of the outstanding product updates occurs automatically.

9. The method of claim 1, further comprising:
causing display of the modified update list in a user interface of the third-party update network; and
receiving user input at the user interface sufficient to publish the subset of the outstanding product updates to a distribution server,
wherein the distributing only the subset of the outstanding product updates is responsive to the managed endpoint accessing the published product updates at the distribution server.

10. The method of claim 1, further comprising:
identifying an unsupported product in the initial update list and in the endpoint-specific inventory, wherein the unsupported product is not updated by the third-party update network;
generating an update package for the unsupported product; and
distributing the update package for the unsupported product to the endpoint via the third-party update network.

11. One or more non-transitory computer-readable media having encoded thereon programming code executable by one or more processors to perform or control performance of operations to automate software management of a managed endpoint, the operations comprising:
generating an initial update list that includes outstanding product updates for a managed endpoint included in a managed network and in a third-party update network;
receiving, from a third-party agent, product metadata related to products loaded on the managed endpoint, the third-party agent being configured to discover the products;
based on discovered products, generating an endpoint-specific inventory that includes product metadata of the products loaded on the managed endpoint;
comparing the outstanding update metadata of the initial update list with the product metadata of the endpoint-specific inventory;
based on the comparison, identifying an unnecessary product update, the unnecessary product update including one of the outstanding product updates that is not related to at least one of the discovered products;
filtering the unnecessary product update from the initial update list to generate a modified update list, the modified update list including a subset of the outstanding product updates and omitting the unnecessary product update; and
distributing only the subset of the outstanding product updates of the modified update list to the managed endpoint such that the outstanding product updates are received by the managed endpoint and implemented locally on the managed endpoint to modify at least one of the discovered products.

12. The one or more non-transitory computer-readable media of claim 11, wherein the operations further comprise importing update metadata from an update catalog that describes cybersecurity vulnerabilities and product updates, wherein the initial update list is based on imported update metadata.

13. The one or more non-transitory computer-readable media of claim 11, wherein the generating the initial update list includes:
importing vulnerability information common vulnerabilities and exposures (CVEs) or information assurance vulnerability alerts (IAVAs);
identifying one or more products that are related to the vulnerability information;
reviewing the update metadata to identify product updates related to the identified products; and
appending the identified product updates to the initial update list.

14. The one or more non-transitory computer-readable media of claim 11, wherein the operations further comprise implementing a third-party API to access the discovered products from the third-party agent.

15. The one or more non-transitory computer-readable media of claim 14, wherein:
the third-party API includes Microsoft Graph API; and
the third-party update network includes Microsoft Intune.

16. The one or more non-transitory computer-readable media of claim 11, wherein the initial update list includes one or more outstanding product updates for the managed endpoint as well as one or more outstanding product updates for additional managed endpoints of the managed network and the third-party update network.

17. The one or more non-transitory computer-readable media of claim 16, wherein the operations further comprise:
receiving additional product metadata from the third-party agent related to the additional managed endpoints; and
based on the initial update lists and the additional product metadata, identifying a subset of the additional endpoints that are missing at least one of the outstanding product updates.

18. The one or more non-transitory computer-readable media of claim 11, wherein the distributing only the subset of the outstanding product updates occurs automatically.

19. The one or more non-transitory computer-readable media of claim 11, wherein the operations further comprise:
causing display of the modified update list in a user interface of the third-party update network; and
receiving user input at the user interface sufficient to publish the subset of the outstanding product updates to a distribution server,
wherein the distributing only the subset of the outstanding product updates is responsive to the managed endpoint accessing the published product updates at the distribution server.

20. The one or more non-transitory computer-readable media of claim 11, wherein the operations further comprise:
identifying an unsupported product in the initial update list and in the endpoint-specific inventory, wherein the unsupported product is not updated by the third-party update network;
generating an update package for the unsupported product; and
distributing the update package for the unsupported product to the endpoint via the third- party update network.

* * * * *